United States Patent [19]  
Akiba et al.

[11] Patent Number: 4,506,367  
[45] Date of Patent: Mar. 19, 1985

[54] DISTRIBUTED FEEDBACK SEMICONDUCTOR LASER

[75] Inventors: Shigeyuki Akiba; Kazuo Sakai, both of Tokyo; Katsuyuki Utaka, Musashino; Yuichi Matsushima, Tokorozawa, all of Japan

[73] Assignee: Kokusai Denshin Denwa Kabushiki Kaisha, Tokyo, Japan

[21] Appl. No.: 433,085

[22] Filed: Oct. 6, 1982

[30] Foreign Application Priority Data

Oct. 9, 1981 [JP] Japan ................................. 56-160112

[51] Int. Cl.³ ............................................. H01S 3/19
[52] U.S. Cl. ......................................... 372/45; 357/17; 372/96
[58] Field of Search ................ 372/44, 45, 96; 357/17

[56] References Cited

PUBLICATIONS

Mikami, "1.55 μm GaInAsP/InP Distributed Feedback Lasers", *Japanese Journal of Applied Physics*, vol. 20, No. 7, Jul. 1981, pp. L488–L490.

Primary Examiner—James W. Davie  
Attorney, Agent, or Firm—Robert E. Burns; Emmanuel J. Lobato; Bruce L. Adams

[57] ABSTRACT

A distributed feedback semiconductor laser which is characterized in that periodic corrugations are performed in the surface of an InGaAsP quaternary layer so that an InP layer is grown thereon so as to overcome difficulties in prior arts.

1 Claim, 4 Drawing Figures

DISTRIBUTED FEEDBACK SEMICONDUCTOR LASER

BACKGROUND OF THE INVENTION

The present invention relates to a distributed feedback semiconductor laser which is stably operable at a single wavelength.

Since an optical fiber exhibits a minimal transmission loss in a wavelength band of 1.5 to 1.6 μm, this wavelength band is drawing attention as a wavelength band for long distance transmission. In this wavelenghth band, however, silica optical fibers have finite chromatic dispersion and, accordingly, it is necessary to employ a semiconductor laser which stably oscillates at a single wavelength even at a high speed modulation. On the other hand, an InGaAsP laser exhibits excellent characteristics using an InP substrate in this wavelength band, and a few distributed feedback lasers of this quaternary system have been fabricated.

BRIEF SUMMARY OF THE INVENTION

An object of the present invention is to provide a distributed feedback semiconductor laser which is characterized in that periodic corrugations are performed in the surface of an InGaAsP quaternary layer so that an InP layer is grown thereon so as to overcome the abovesaid difficulties.

In accordance with the present invention, there is provided a distributed feedback semiconductor laser which has periodic corrugations in a light emitting layer or an adjoining layer in the direction of travel of light and performs laser oscillation by the injection of current into said light emitting layer, characterized in that said periodic corrugations are formed in the surface of an InGaAsP layer provided on an InP substrate.

BRIEF DESCRIPTION OF THE DRAWINGS

The present invention will be described in detail below in comparison with prior arts with reference to the accompanying drawings, in which.

DETAILED DESCRIPTION

For ready understanding of the present invention, an example of prior arts will first be described.

Figure 1A:
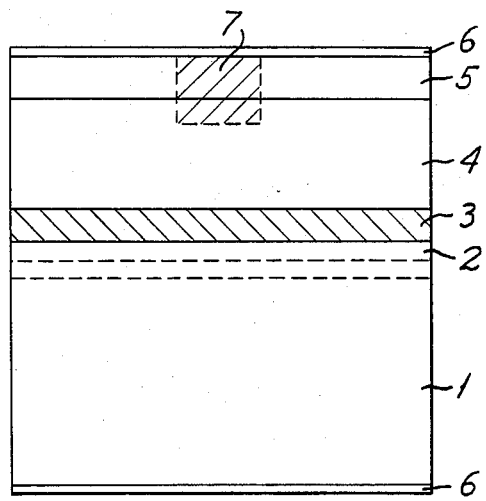
FIGS. 1A and 1B are a front view and a longitudinal sectional view showing an example of the construction of a conventional InGaAsP distributed feedback semiconductor laser.
Figure 1B:
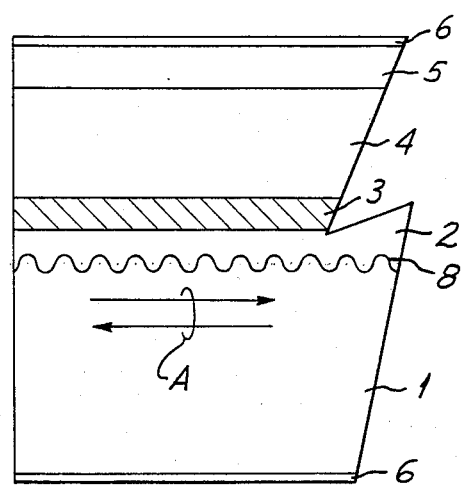

FIGS. 1A and 1B are respectively a front view and a side view of the cross-section of its center illustrating an example of the conventional distributed feedback semiconductor lasers utilizing the InGaAsP alloy. For instance, periodic corrugations 8 are formed on the surface of an n type InP substrate 1 to extend in the direction of travel of light indicated by the arrows A and, in the example of FIG. 1, an n type InGaAsP layer 2, an InGaAsP light emitting layer 3, a p type InP layer 4 and an n type InGaAsP layer 5 are grown in this order on the substrate surface, after which a p type dopant, for example, Zn or the like, is diffused into a region 7 in the form of a stripe and an electorde 6 is provided to obtain a laser. Further, a laser without the n type InGaAsP layer 2 has also been reported.

It has been reported that such a prior art distributed feedback laser performs a pulsed oscillation, but it is still unable to perform a CW oscillation at a room temperature. The following reason is considered therefore: It is difficult to grow a quaternary crystal of good quality on the InP substrate 1 having corrugations in the surface thereof and the corrugations disappear or their depth diminishes to decrease the gain by the distributed feedback, resulting the current density at a threshold value for oscillation becoming abnormally high. One of the reasons for which the corrugations on the InP substrate 1 disappear or diminishes is considered as follows: Since the degree of supersaturation of the melt for the liquid phase epitaxy cannot be raised so high because the quaternary layer is grown thereon, a meltback of the substrate surface is caused, or although the surface of the InP substrate 1 has a plane <100> macroscopically, it has other surface orientations microscopically, such as a plane <111> and so on, due to the corrugations, and this introduces disagreement in the lattice constant of the quaternary layer, by which an equilibrating process is performed to once melt back the substrate surface, providing the flat <100> plane.

The present invention will hereinafter be described in detail.

Figure 2A:
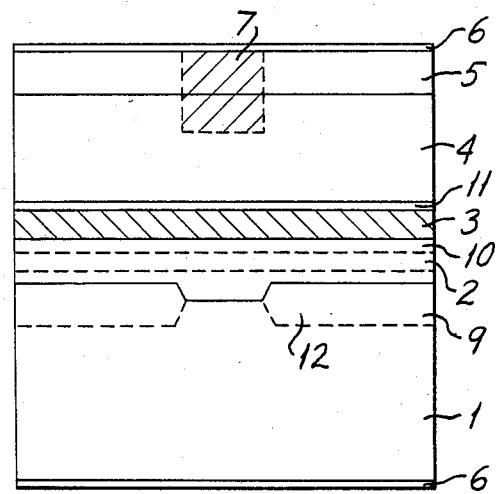
FIGS. 2A and 2B are a front view and a longitudinal sectional view illustrating an example of the present invention.
Figure 2B:
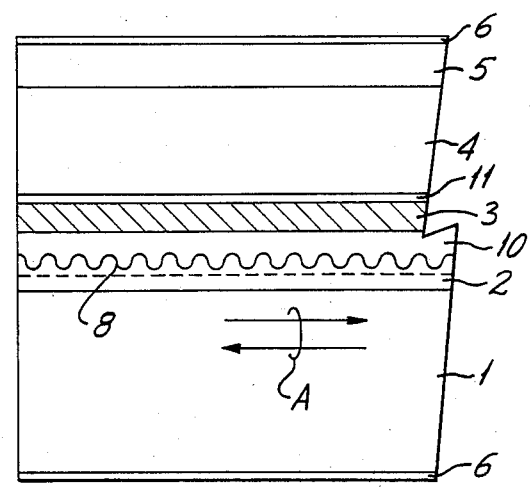

FIG. 2 illustrates an example of the present invention, and the following description will be given thereof. At first, an n type InGaAsP layer 2 is grown on an n type InP substrate 1 in which are provided a groove for lateral mode control and a pn junction which improves the current confinement effect in this case, and corrugations 8 are formed in the surface of the layer. Then, an n type InP layer 10, a light emitting layer 3 an a p type InP layer 4 are formed one after another, and the subsequent fabrication steps are the same as those in the case of FIG. 1. In FIG. 2, however, there is shown an example in which a quaternary layer 11 the forbidden band gap of which is smaller than that of the InP but larger than that of the light emitting layer 3 is sandwiched between the InGaAsP light emitting layer 3 and the p type InP layer 4. When forming the p type InP layer 4 directly on the light emitting player 3, there is a fear of causing a meltback but, by inserting therebetween the quaternary layer 11, the meltback can be prevented. With such an arrangement, since the InP layer 10 is formed directly on the corrugated surface of the quaternary layer 2, the degree of supersaturation of the InP can be raised appreciably high, and the same liquidus composition can be used for the growth onto any surface orientations with lattice matching; therefore, the problems experienced in the past are solved and corrugations of good quality are formed. Further, the use of the substrate having the groove stablilizes the lateral mode, too, which, coupled with the stabilization of the vertical mode by the corrugations, ensures extreme stabilization of the oscillation wavelength. Moreover, since the pn junction 12 is formed near the substrate surface except the groove, current is cut off in that region owing to a reverse bias effect, centering a current on the grooved portion, i.e. the oscillating portion.

Since such features as described above all serve to reduce the operating current, an appreciably small oscillation threshold value is obtained, permitting the CW operation at a room temperature, too.

The laser of the present invention basically features the lamination of InP on the quaternary layer having periodic corrugations, and can also be applied to other cases than the example of using the grooved substrate described with regard to FIG. 2. For instance, it is also possible to form on a flat substrate a layer structure similar to that shown in FIG. 2 and then to obtain a buried hetero-structure laser for the lateral mode stablilzation.

As has been described in the foregoing, according to the present invention, it is possible to obtain a distributed feedback semiconductor laser which is cable of the CW operation at a room temperature in the wavelength band in which the transmission loss of the optical fiber is small. Accordingly, the present invention is of great utility when employed in the optical fiber transmission system with a wide bandwidth and a long repeater spacing.

What we claim is:

1. A distributed feedback semiconductor laser having an InP substrate, a multiplicity of semiconductor layers including an n-type InGaAsP layer formed on said substrate, an n-type InP layer and an InGaAsP light-emitting layer successively overlying the n-type InGaAsP layer, periodic corrugations disposed on a surface remote from the substrate between the n-type InP layer and said n-type InGaAsP layer and disposed to extend in the direction of travel of light, and electrodes to apply current to the laser.

* * * * *